(12) United States Patent
Toh et al.

(10) Patent No.: US 10,020,394 B2
(45) Date of Patent: Jul. 10, 2018

(54) EXTENDED DRAIN METAL-OXIDE-SEMICONDUCTOR TRANSISTOR

(71) Applicant: GLOBALFOUNDRIES Singapore Pte. Ltd., Singapore (SG)

(72) Inventors: Rui Tze Toh, Singapore (SG); Guan Huei See, Singapore (SG); Shaoqiang Zhang, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/883,056

(22) Filed: Jan. 29, 2018

(65) Prior Publication Data
US 2018/0151726 A1   May 31, 2018

Related U.S. Application Data

(62) Division of application No. 15/159,830, filed on May 20, 2016, now Pat. No. 9,899,514.

(60) Provisional application No. 62/165,168, filed on May 21, 2015.

(51) Int. Cl.
| H01L 29/78 | (2006.01) |
| H01L 29/66 | (2006.01) |
| H01L 29/10 | (2006.01) |

(52) U.S. Cl.
CPC ...... *H01L 29/7824* (2013.01); *H01L 29/1095* (2013.01); *H01L 29/665* (2013.01); *H01L 29/66681* (2013.01); *H01L 29/66689* (2013.01); *H01L 29/66742* (2013.01)

(58) Field of Classification Search
CPC ............ H01L 29/7824; H01L 29/1095; H01L 29/665; H01L 29/66681; H01L 29/66689; H01L 29/66742
USPC ......................................................... 257/336
See application file for complete search history.

(56) References Cited

U.S. PATENT DOCUMENTS

| 2004/0173859 A1 | 9/2004 | Hao et al. |
| 2005/0148148 A1 | 7/2005 | Cheng |
| 2006/0284726 A1 | 12/2006 | Crochon et al. |
| 2009/0090979 A1* | 4/2009 | Zhu .................... H01L 21/26586 257/408 |
| 2009/0108350 A1* | 4/2009 | Cai ..................... H01L 29/1083 257/347 |

(Continued)

OTHER PUBLICATIONS

O. Bon et al., "High voltage devices added to a 0.13/spl mu/m high resistivity thin SOI CMOS process for mixed analog-RF circuits", SOI conference, 2005, IEEE.

(Continued)

*Primary Examiner* — Dzung Tran
(74) *Attorney, Agent, or Firm* — Horizon IP PTE Ltd.

(57) ABSTRACT

Devices and methods for forming a device are disclosed. A substrate is provided. A first body well of a second polarity type is formed in the substrate. A second body well of the second polarity type is formed in the first body well. A bottom of the second body well and a bottom of the first body well are contiguous. Dopant concentrations of the first and second body wells include a graded profile. A transistor of a first polarity type is formed over the substrate. The transistor includes a source and a drain. The source is formed in the second body well.

20 Claims, 16 Drawing Sheets

(56) References Cited

U.S. PATENT DOCUMENTS

| | | | |
|---|---|---|---|
| 2010/0038724 A1* | 2/2010 | Anderson | H01L 21/82345 257/392 |
| 2011/0074498 A1* | 3/2011 | Thompson | H01L 21/823412 327/543 |
| 2011/0121404 A1 | 5/2011 | Shifren et al. | |
| 2011/0260247 A1 | 10/2011 | Yang et al. | |
| 2012/0211832 A1 | 8/2012 | Chu et al. | |
| 2012/0223363 A1* | 9/2012 | Kronholz | H01L 21/823412 257/190 |
| 2012/0273883 A1 | 11/2012 | Chen et al. | |

OTHER PUBLICATIONS

Kai Lu et al., "Improvement of RF Performance by Using Tunnel Diode Body Contact Structure in PD SOI nMOSFETs", Electron Device Letters, Jan. 2014, pp. 15-17, vol. 35, No. 1, IEEE.

James G. Fiorenza et al., "RF Power LDMOSFET on SOI", Electron Device Letters, Mar. 2001, pp. 139-141, vol. 22, No. 3, IEEE.

* cited by examiner

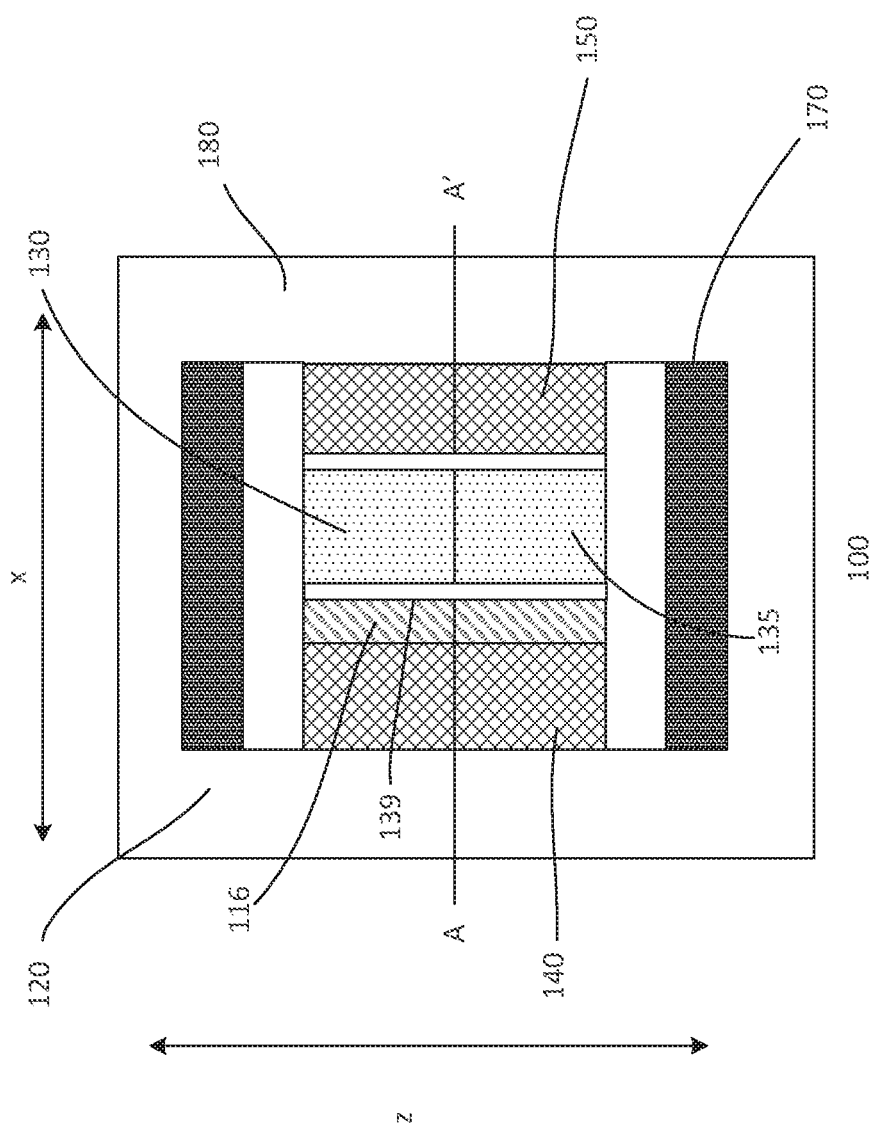

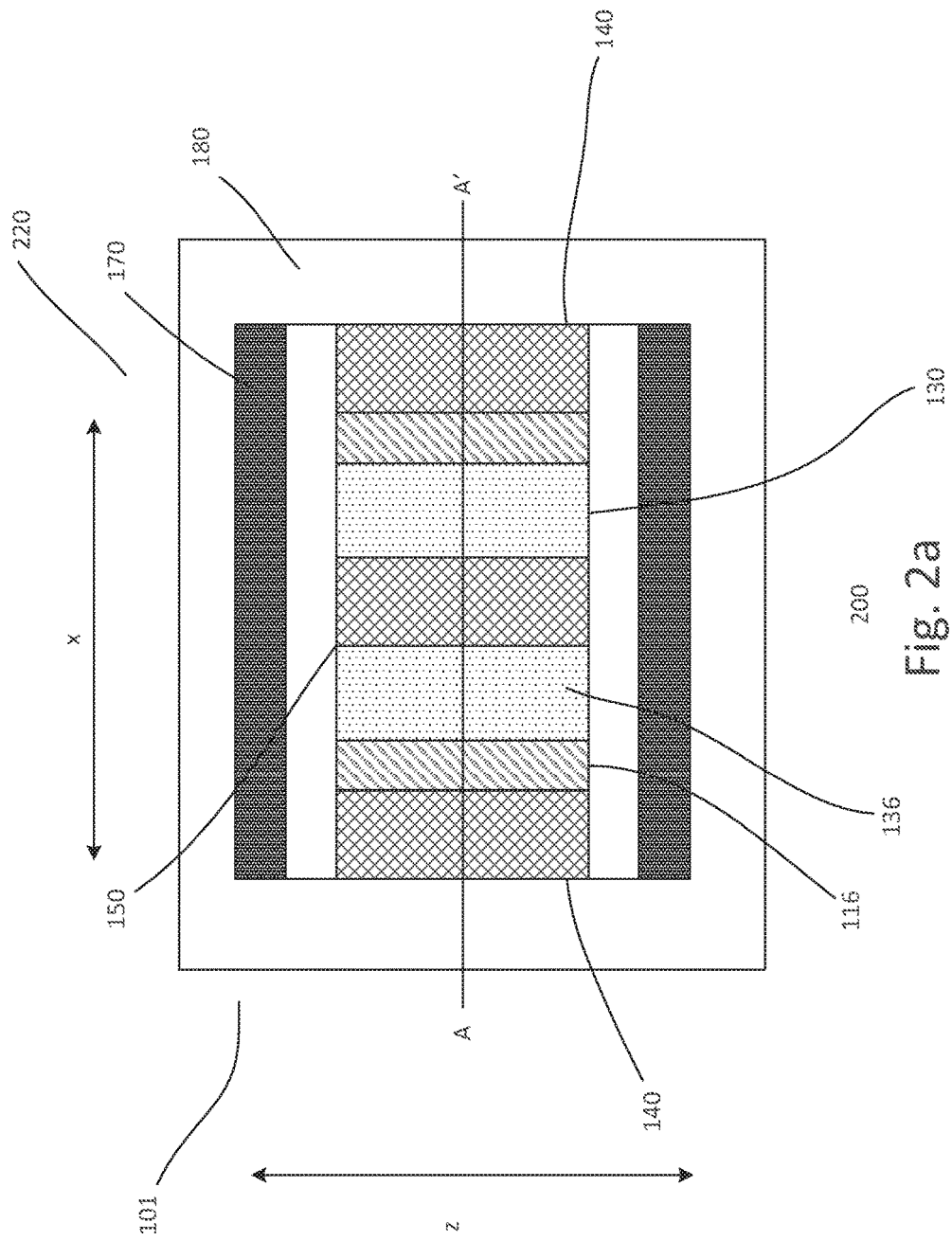

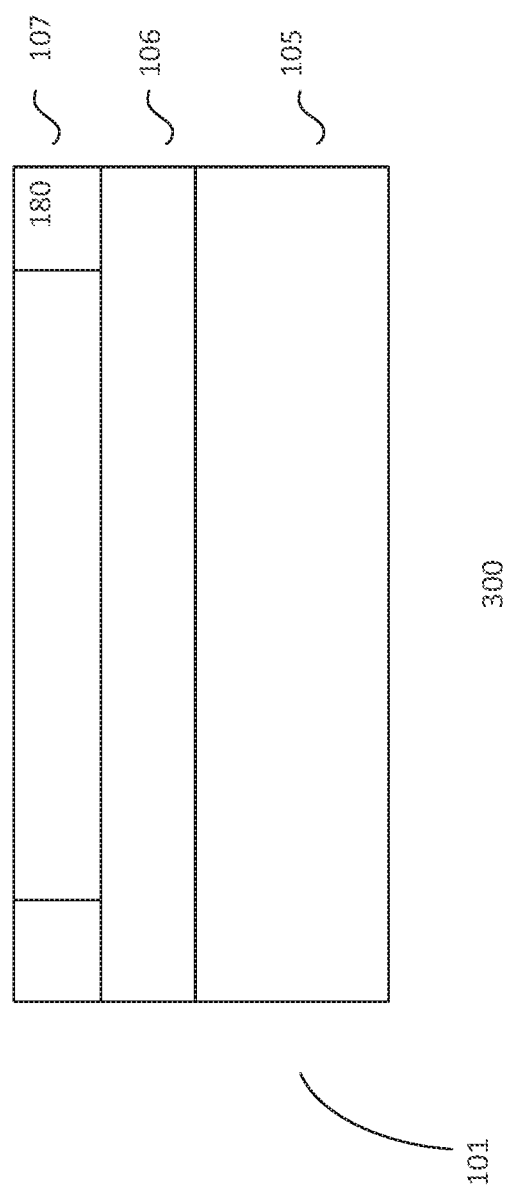

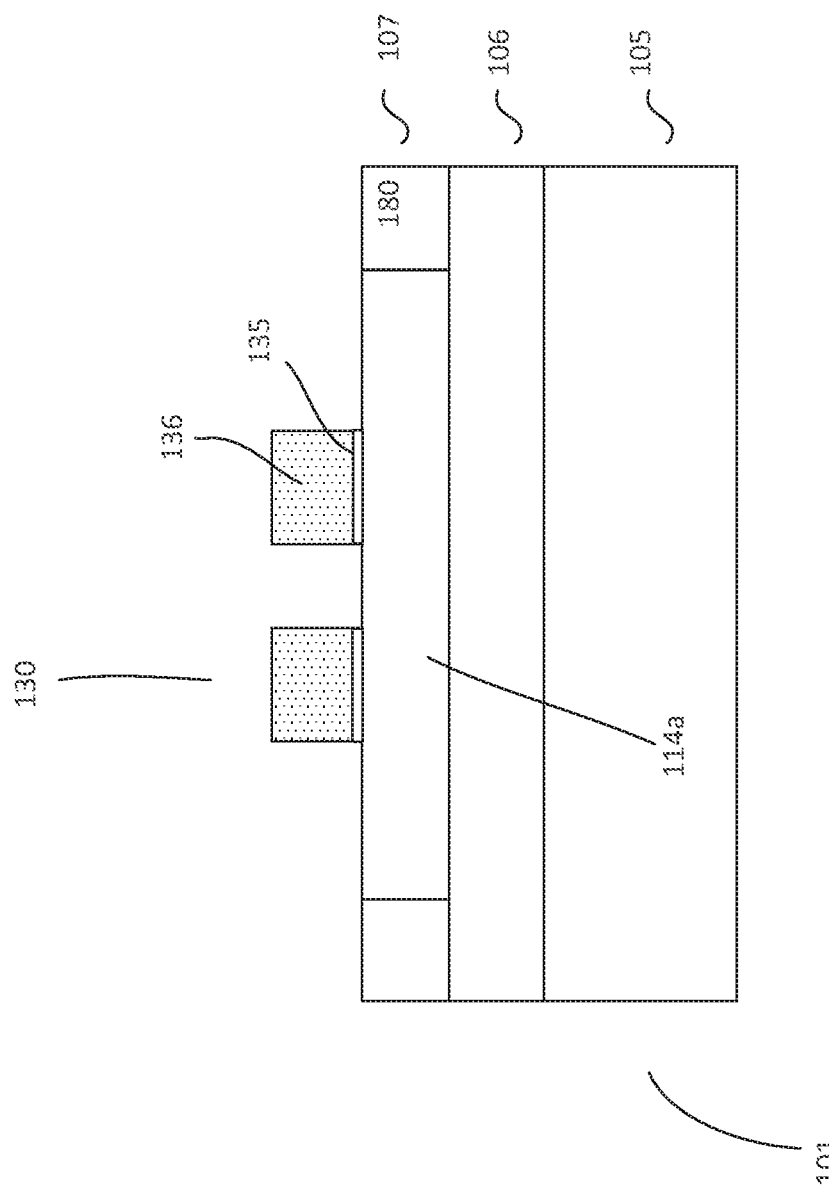

EXTENDED DRAIN METAL-OXIDE-SEMICONDUCTOR TRANSISTOR

CROSS-REFERENCE TO RELATED APPLICATION

This application claims the priority benefit of U.S. Non-Provisional application Ser. No. 15/159,830, filed on May 20, 2016, which claims the priority benefit of U.S. Provisional Application Ser. No. 62/165,168, filed on May 21, 2015, which is hereby incorporated by reference in its entirety for all purposes.

BACKGROUND

Kink-effect on the drain current and parasitic bipolar junction transistor (BJT) effect are problems commonly observed for thin film silicon-on-insulator (SOI) devices. The problems become more prominent if the devices operate in high frequency, causing the breakdown voltage to reduce significantly.

To date, the technology provides modification on the body contact region in an effort to eliminate the aforementioned problems, for example, by bringing the body contact closer to the channel of the device. Such modification increases the device width which is a setback to the device scaling. Furthermore, the breakdown voltage of the device does not seem to be enhanced by such modification.

The present disclosure provides a structure design which suppresses the kink-effect and parasitic BJT effect of a SOI device and a method for forming such a device.

SUMMARY

Embodiments of the present disclosure generally relate to semiconductor device and method for forming a semiconductor device. In one embodiment, a method is disclosed. The method includes providing a substrate. A first body well of a second polarity type is formed in the substrate. A second body well of the second polarity type is formed in the first body well. A bottom of the second body well and a bottom of the first body well are contiguous. Dopant concentrations of the first and second body wells include a graded profile. A transistor of a first polarity type is formed over the substrate. The transistor includes a source and a drain. The source is formed in the second body well.

In one embodiment, a device is disclosed. The device includes a substrate. A first body well of a second polarity type is disposed in the substrate. A second body well of the second polarity type is disposed in the first body well. A bottom of the second body well and a bottom of the first body well are contiguous. Dopant concentrations of the first and second body wells include a graded profile. A transistor of a first polarity type is disposed over the substrate. The transistor includes a source and a drain. The source is disposed in the second body well.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1b show a simplified plan view and a simplified cross-sectional view of an embodiment of a device;

FIGS. 2a-2b show a simplified plan view and a simplified cross-sectional view of an embodiment of a device.

DETAILED DESCRIPTION

Embodiments generally relate to semiconductor devices or integrated circuits (ICs). More particularly, some embodiments relate to high voltage (HV) and intermediate (medium) voltage (MV) transistors. For example, transistors include extended drain (ED) transistors, such as extended gate metal oxide semiconductor (EDMOS) transistors. The MV transistors can be employed as switching voltage regulators for power management applications. The EDMOS transistors may be configured as common source devices which can be used as a power amplifier and a low noise amplifier. The various types of transistors can be easily integrated into devices or ICs. The devices or ICs can be incorporated into or used with, for example, consumer electronic products, particularly portable consumer products, such as cell phones, laptop computers and personal digital assistants (PDAs).

Figure 1B:
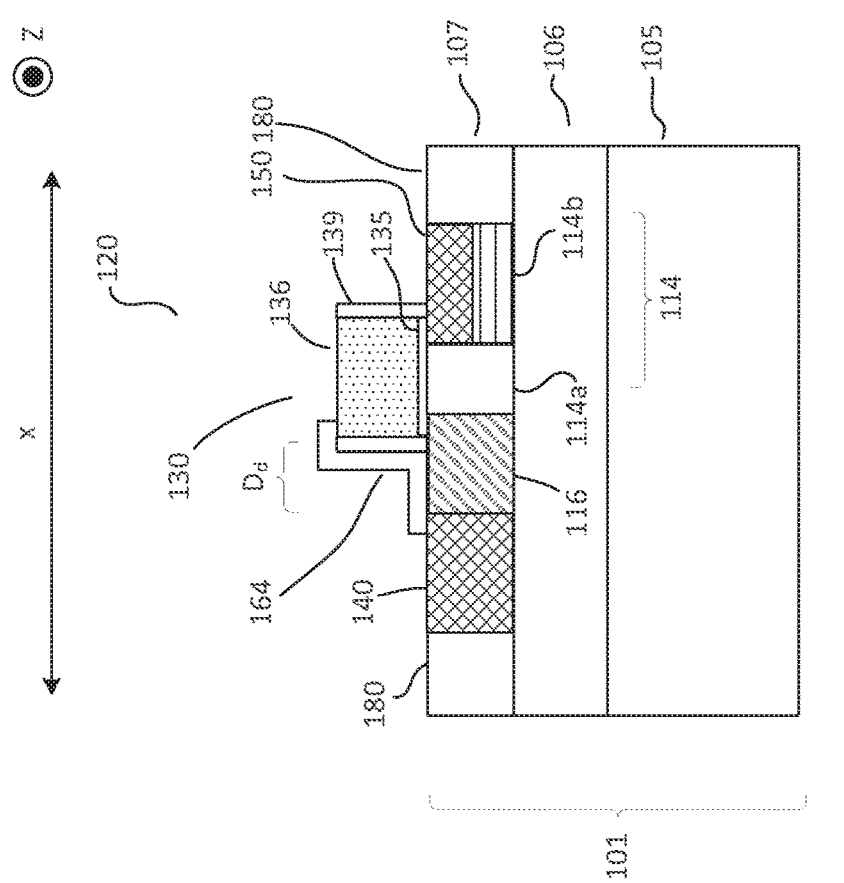

FIGS. 1a-1b show top (layout) and cross-sectional views of a portion of a device 100. The cross-sectional view is along A-A'. The device, for example, is an IC. Other types of devices may also be useful. As shown, the device 100 includes a substrate 101. In one embodiment, the substrate 101 is crystal-on-insulator (COI) substrate. The substrate, for example, is a silicon-on-insulator (SOI) substrate. The SOI substrate 101 includes a top or surface crystalline or silicon layer 107, a bulk crystalline or silicon 105 and a buried oxide (BOX) layer 106 sandwiched between the surface silicon layer 107 and the bulk silicon 105. Other types of crystalline materials, such as silicon germanium may also be useful. The SOI substrate, for example, is a thin film SOI substrate. In one embodiment, the thickness of the surface crystalline or silicon layer 107 may be about 1400 Å, the thickness of the BOX layer 106 may be about 4000 Å and the thickness of the bulk crystalline or silicon 105 may be about 725 μm. Other thicknesses may also be useful.

The device 100 may include doped regions having different dopant concentrations. For example, the device 100 may include heavily doped ($x^+$), intermediately doped (x) and lightly doped (x) regions, where x is the polarity type which can be p or n. A lightly doped region may have a dopant concentration of about $10^{15}/cm^3$, an intermediately doped region may have a dopant concentration of about $10^{18}/cm^3$, and a heavily doped region may have a dopant concentration of about $10^{21}/cm^3$. Providing other dopant concentrations for the different doped regions may also be useful. For example, the doping concentrations for the different types of doped regions may be relative and depend on the technology node. P-type dopants may include boron (B), aluminum (Al), indium (In) or a combination thereof, while n-type dopants may include phosphorous (P), arsenic (As), antimony (Sb) or a combination thereof.

The substrate 101 includes a device region. The device region, for example, is a device region for a transistor 120. In one embodiment, the device region includes an extended drain MOS (EDMOS) transistor 120. Providing other types of devices in the device region may also be useful. The substrate 101 may also include regions for other types of circuitry, depending on the type of device or IC. For example, the device may also include regions for an array region for accommodating memory devices.

Isolation regions may be provided for isolating or separating different regions of the substrate. In one embodiment, the device region is isolated from other regions by a device isolation region 180. For example, the device isolation region surrounds the device region. The isolation region, for example, is a shallow trench isolation (STI) region. An STI region includes an isolation trench filled with isolation or dielectric materials. Other types of isolation regions may also be employed. The isolation region, for example, extends to the top surface of the BOX layer 106. Providing isolation regions which extend to other depths may also be useful.

The device region includes a first device well 114a. The first device well, in one embodiment, is a second polarity type doped well. The first device well serves as a body of a first polarity type transistor. For example, a p-type device well serves as a body of a n-type transistor. Alternatively, a n-type device well serves as a body of a p-type transistor. In one embodiment, the first device well may be an intermediately doped second polarity type device well. For example, the dopant concentration of the first device well may be about $10^{18}/cm^3$. Other dopant concentrations may also be useful. The first device well preferably is doped with lighter second polarity type dopants. For example, the second polarity type dopants include boron (B). In one embodiment, the first device well forms a first part of a body of the transistor.

A gate 130 of the transistor 120 is disposed on the surface of the substrate 101. For example, the gate is disposed on the surface of the surface silicon layer 107 of the substrate 101. The gate, in one embodiment, includes a gate electrode 136 over a gate dielectric 135. The gate dielectric 135, for example, may be silicon oxide while the gate electrode 136 may be polysilicon. The gate dielectric 135, for example, may be about 55-65 Å. The gate dielectric layer 135, in one embodiment, is a high voltage or medium gate dielectric layer having a thickness of about 100 Å, while the gate electrode 136 may be about 1000-1600 Å thick. In some embodiments, the gate electrode 136 may be a doped electrode. For example, the gate electrode 126 may be polysilicon doped with first polarity type dopants. Other types of gate dielectrics and gate electrodes as well as thicknesses may also be useful. For example, the gate dielectric 135 may be a high k gate dielectric for improving high frequency performance and/or the gate electrode may be a metal gate electrode. Other configurations of gate layers of the gate may also be useful. The gate, for example, traverses the device region along the z direction. The width of the gate along a channel length direction of the transistor 120 may be about 10-25 μm. Other widths may also be useful. As shown, the channel direction is in the x direction. The x and z directions, for example, are orthogonal directions.

Sidewall spacers 139 may be provided on the sidewalls of the gate. The sidewall spacers, for example, are dielectric spacers. The dielectric spacers, for example, may be silicon oxide spacers. Other types of dielectric material, such as silicon nitride, may also be used. The thickness of the dielectric spacers may be, for example, 600-700 Å. Other thickness for the dielectric spacers may also be useful. The thickness, for example, may depend on the desired width of the dielectric spacers. In some applications, the dielectric spacer may be formed from multiple dielectric layers.

In one embodiment, a drift well 116 is provided in the device region. The drift well is provided adjacent a first side of the device region. For example, the drift well is provided on a drain side of the device region. The drift well may be from the drain side edge of the device region and extends below a first side or drain side of the sidewall of the gate. For example, the first sidewall of the gate overlaps the drift well. The drift well extends under the gate for about 0.1-0.15 μm. Other configurations of the drift well may also be useful. The drift well is a first polarity type doped well. For example, the drift well has the same polarity type of dopants as the device type. For example, the drift well is a n-type drift well for a n-type device. In one embodiment, the drift well is a lightly doped first polarity type doped well. The dopant concentration, for example, is significantly lower than a typical LDD implant. In one embodiment, the dopant concentration of the drift well may be about $10^{15}/cm^3$. Other dopant concentration for the drift well may also be useful. The lightly doped drift well reduces impact ionization at the drain side of the gate. In one embodiment, the drift well is doped with first polarity type dopants which have high diffusivity, such as phosphorus (P).

The transistor 120 includes first and second doped or source/drain (S/D) regions 140 and 150 in the surface crystalline layer 107. As shown, the first S/D region is disposed in a first side of the device region and the second S/D region is disposed in a second side of the device region. For example, the first S/D region is in the device region on which the first sidewall of the gate is located and the second S/D region is in the device region on the which the second sidewall of the gate is located. The first S/D region may be referred to as the drain and the second S/D region may be referred to as the source. For example, the drain is subjected to a higher voltage relative to the source. For the applications of input/output (I/O) thick oxide devices, when a voltage (VG) of 3.3 V is applied to the gate, the output voltage (VD) at the drain can be up to 5-12 V while the source is coupled to ground or 0 V. As for MV architectures, a voltage of more than 5 V is applied to the gate, whereas for HV architectures, a voltage of up to 12 V is applied to the gate. Providing the drain and source with other voltages may also be useful.

The drain is heavily doped with same polarity type dopants as the device type. The drain, for example, is n+ doped regions for a n-type device or p+ doped regions for a p-type device. The dopant concentration of the drain is higher than the drift well. The dopant concentration of the drain regions may be about $10^{21}/cm^3$. Other dopant concentrations may also be useful. The drain preferably is doped with the heaviest first polarity dopant types. For example, in the case of n-type S/D regions, the n-type dopants include arsenic (As). In the case of p-type S/D regions, the p-type dopants include $BF_2$.

In one embodiment, the source and drain are asymmetrically doped regions with different depths. As shown, the depth of the drain 140 is deeper than the depth of the source 150. In one embodiment, the drain extends the full thickness of the surface crystalline layer 107. For example, the drain is from the surface of the surface crystalline layer to BOX layer. On the other hand, the source extends from the surface to only a partial thickness of the surface crystalline layer 107. For example, the source only occupies an upper portion of the surface crystalline layer.

As shown, the drain 140 is displaced from the first sidewall of the gate. The drain may be disposed in the drift well and displaced from the first sidewall of the gate. For example, the drain may be disposed in the device region from the isolation region to a displacement distance Da from the first sidewall of the gate. The drift well provides connection between the drain and the gate. The drift well, by having a lower doping concentration than the drain, reduced impact ionization is achieved on the drain side of the gate. This increases gate dielectric breakdown voltage (BV), improving reliability. Furthermore, extending the drain from the surface of the surface crystalline layer 107 to the BOX layer 106 reduces or eliminates impact ionization and increases the breakdown voltage of the transistor, improving performance.

The source 150, as shown, is disposed in the device region adjacent to the second gate sidewall. As discussed, the source extends a partial depth of the surface crystalline layer 107. The source may be an ultra-shallow junction. For example, the source may extend a depth of about 500-800 Å, depending on substrate thickness. Other depths may also be useful. The source may have a depth as a lightly doped drain (LDD) extension with the exception of a higher dopant concentration. For example, the implant parameters, such as power, may be used to form LDD extensions. By using heavy dopants for the source, such as arsenic (As), a box like dopant profile can be produced which is advantageous for ultra-shallow junctions. Furthermore, minimal lateral and vertical diffusion occurs during subsequent thermal processes due to their large mass.

In one embodiment, below the source, a second device well 114b is provided. The second device well forms a second part of the body of the transistor 120. Similar to the first device well 114a, the second device well serves as a body of a first polarity type transistor. In one embodiment, the second device well is an intermediately doped second polarity type device well. For example, the second device well is an intermediately doped p-type (p−) body well for a n-type transistor. The presence of the intermediately doped second body well suppresses the BJT effect and reduces the body resistance. In other embodiments, the second device well has a lower dopant concentration than the first device well. For example, the second device well is a lightly doped second polarity type device well. The lightly doped second device well increases the body resistance and induces floating body effect due to the thin-film SOI substrate. Such effect provides an unexpected body enhancement for the transistor. For example, in addition to improving hot carrier reliability, the breakdown voltage of the transistor can be maintained or increased by tailoring the graded doping profile of the first, second device well and source. The dopant concentration of the second device well may be about $10^{15}$-$10^{18}$/cm$^3$. Other dopant concentrations may also be useful.

The second device well 114b may be provided by ion implantation. For example, second polarity type ions are implanted into the first device well 114a under the source for an n-type transistor, forming a p-type second device well. The p-type device well serves as a second body of the n-type transistor. Alternatively, a n-type device well serves as a second body of a p-type transistor. The implant, for example, is a vertical self-aligned implant. Implanting second polarity type dopants into the first device well, forms contiguous first and second device wells. In one embodiment, the second device well includes dopants which are lighter than the dopants of the source. For example, in the case where the source includes arsenic (As) dopants, the second device well may include boron (B). In one embodiment, a vertical $BF_2$ implant is performed to form a p− second device well. A $BF_2$ implant has diffusion retarding effect and is suitable for producing a source having an ultra-shallow junction. For example, the presence of fluorine traps interstitial silicon, lowering the diffusion effect. As a result, diffusion of the lighter dopants into the source caused by subsequent thermal processing is reduced and a shallow junction depth of the source can be obtained.

By providing a second device well under the source, increased body area is provided for the transistor. For example, the body area is increased by the area of the source. This may be significant and facilitate in suppressing the parasitic BJT by increasing the base area. Furthermore, the second device well has little impact of gate threshold voltage of the device. For example, the threshold voltage device shows little sensitivity by the addition of the second device well.

A silicide blocker 164 is provided, as shown in FIG. 1b. For illustration purpose, the silicide blocker 140 is omitted in the plan view as shown in FIG. 1a. In one embodiment, the silicide blocker is a dielectric silicide blocker. For example, the silicide blocker is a silicon oxide silicide blocker. Other types of dielectric materials may also be useful. The silicide blocker is disposed on the substrate over the drift well 116. To ensure that the drift is completely covered, the silicide blocker extends to cover a portion of the gate and drain. The thickness of the silicide blocker may be about 400-700 Å. Other thicknesses may also be useful. The silicide blocker prevents a metal silicide contact (not shown) from forming on the drift well during salicidation. The metal silicide contact may be a nickel-based silicide contact. Other types of contacts may also be useful.

A body contact 170 is provided to bias the body of the transistor 120. For example, the body contact biases both first and second device wells 114a and 114b which form the body of the transistor. The body contact is a heavily doped second polarity type region. For example, the dopant concentration of the body contact is about $10^{21}$/cm$^3$. Other dopant concentrations may also be useful. In one embodiment, first and second body contacts are provided in first and second sides of the device region along the channel length (x) direction. Providing the body contacts along the channel length direction increases the contact area and hence, reducing body resistance. In other words, the final width of the device is no longer limited by the body contacts. Furthermore, unlike the conventional way of providing the body contacts adjacent to the source, the length of the channel is not being compromised. The body contact can extend from the surface of the surface layer to the top of the BOX layer. For example, the body contact extends the thickness of the surface crystalline or silicon layer 107. Other configurations of the body contacts may also be useful.

Metal silicide contacts (not shown) are provided on terminals or contact regions of the transistor 120 and body contact 170. The metal silicide contacts may be self-aligned to exposed crystalline materials. For example, metal silicide contacts are provided on the top surface of the gate electrode 136 not covered by the salicide blocker 164, source 150, drain 140 and body contact 170. The metal silicide contacts, for example, may be nickel-based silicide contacts. Other types of metal silicide contacts may also be useful. For example, the metal silicide contact may be cobalt silicide (CoSi). The silicide contacts may be about 300 Å thick. Other thickness of silicide contacts may also be useful. The silicide contacts may be employed to reduce contact resistance and facilitate contact to the back-end-of-line metal interconnects.

A dielectric layer (not shown) is disposed on the substrate, covering the transistor. The dielectric layer, in one embodiment, serves as a pre-metal dielectric (PMD) layer. The dielectric layer, for example, is a silicon oxide layer. In one embodiment, the dielectric layer is a high aspect ratio process (HARP) dielectric material. Other types of dielectric materials are also useful. For example, the dielectric layer can be formed from doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and fluorine-doped silicate glass (FSG).

In one embodiment, the PMD layer includes trenches for accommodating contact plugs (not shown) which are electrically connected to contact regions of the transistor 120. For example, contacts plugs are provided in the trenches of the PMD layer to the metal silicide contacts disposed on the gate electrode, source region, drain region and body bias contact region. The contact plugs, for example, may be tungsten contact plugs. Other types of conductive contact plugs may also be useful.

Figure 2B:
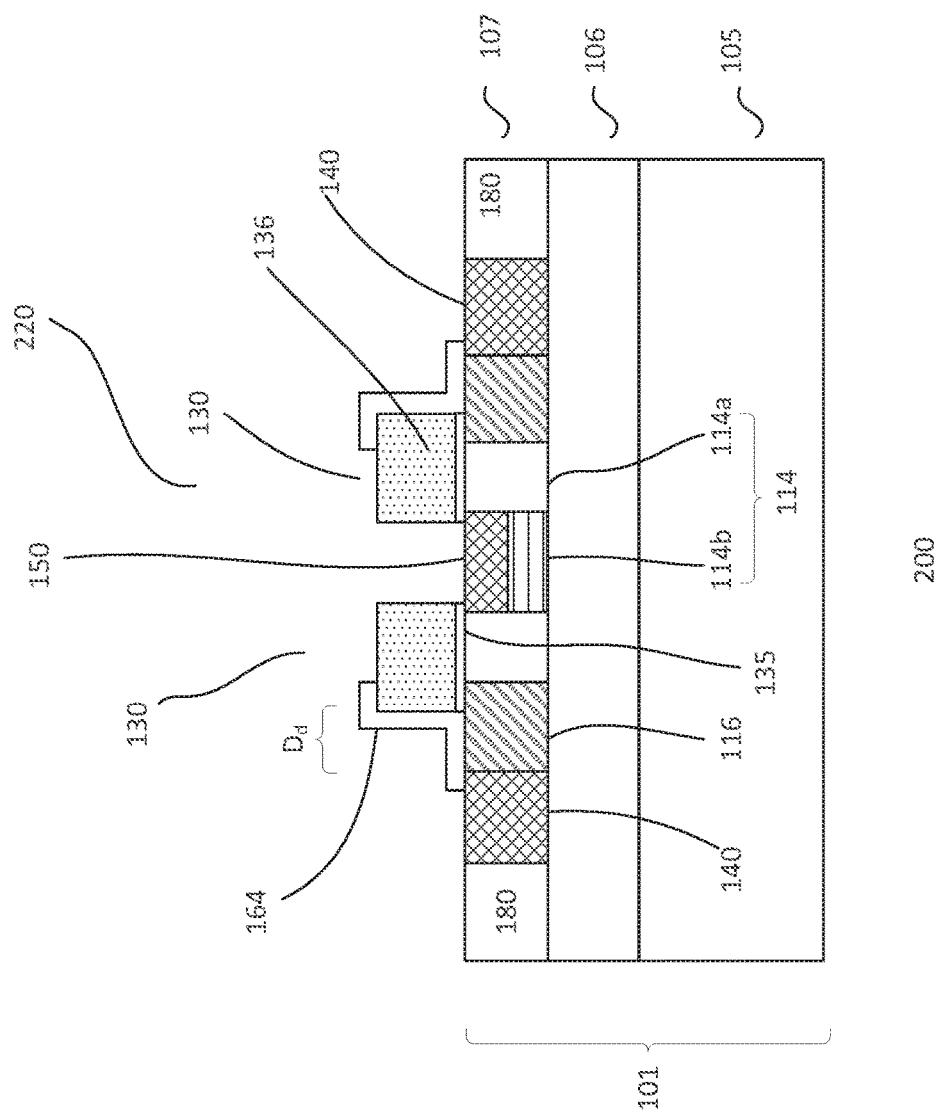

FIGS. 2a-2b show top (layout) and cross-sectional views of a portion of a device 200. The cross-sectional view is along A-A'. The device is similar to the device of FIGS. 1a-1b. Common elements may not be described or described in detail.

As shown, the device includes is a EDMOS transistor device 220 formed on a COI substrate 101, such as a SOI substrate. For example, the COI substrate includes a surface crystalline layer 107 and a bulk crystalline layer 105 sandwiching a BOX layer 106. The transistor device is disposed in a device region on the surface layer which, for example, is surrounded by an isolation region, such as a STI region 180. The STI extends to the BOX layer. The device region includes a first device well 114a and a second device well 114b. The first device well includes second polarity type dopants. For example, the first device well is a lightly doped second polarity type well. The first device well serves as a first body of a first polarity type device. The second device well includes second polarity type dopants. In one embodiment, the second device well is an intermediately doped second polarity type well. In other embodiments, the second device well is a lightly doped second polarity type well. The second device well serves as a second body of a first polarity type device.

In one embodiment, the transistor is a dual gate transistor having first and second gates 130 on the surface of the surface crystalline layer. The gates traverse the device region along the channel width or z direction. A gate includes a gate electrode 136 disposed over a gate dielectric 135. The gate electrode may be a polysilicon gate electrode and the gate dielectric may be a thermally grown silicon oxide gate dielectric. Other types of gate electrodes and gate dielectrics may also be useful. Dielectric sidewall spacers (not shown) may be provided on the sidewalls of the gate.

In one embodiment, the device region includes first and second drift wells 116 on drain sides of the first and second gates. As shown, the drain sides of the gates are opposite sides of the gates while the source sides of the gates are adjacent sides of the first and second gates. The drift wells are intermediately doped first polarity type doped wells. The drift wells, for example, extend under the first sidewall or drain side of the gate. First and second drains 140 are disposed in the drift well. The drains are displaced from the first gate sidewalls of the gates by $D_d$. Disposed between the gates is a source 150. In one embodiment, the source is an ultra-shallow junction. The source serves as a common source (i.e., a grounded source) for both the first and second gates. A second body well 114b is disposed below the source. For example, the second body well is disposed between and contiguous with the source and BOX layer.

Silicide blockers 164 are provided. A silicide blocker covers a drift well. For example, a first silicide blocker covers the first drift well and a second silicide blocker covers the second drift well. As shown, a silicide blocker covers a first sidewall of the gate and a portion of the drain. This ensures that a drift well is completely covered by a silicide blocker.

A body contact 170 is provided to bias the body of the transistor. For example, the body contact biases both first and second body wells which form the body of the transistor. In one embodiment, first and second body contacts are provided in first and second sides of the device region along the channel length (x) direction. In other embodiments, a body contact may be provided between the gates, separating the common source into first and second source.

FIGS. 3a-3l show cross-sectional views of an embodiment of a process for forming a device 300. The device, for example, is similar to that described in FIGS. 2a-2b. For example, the device is a EDMOS dual gate transistor. As such, common elements may not be described or described in detail.

Referring to FIG. 3a, a substrate 101 is provided. In one embodiment, the substrate 101 is crystal-on-insulator (COI) substrate. The substrate, for example, is a silicon-on-insulator (SOI) substrate. The SOI substrate 101 includes a top or surface crystalline or silicon layer 107, a bulk crystalline or silicon 105 and a buried oxide (BOX) layer 106 sandwiched between the surface crystalline or silicon layer 107 and the bulk crystalline or silicon 105. Other types of crystalline materials, such as silicon germanium may also be useful. In one embodiment, the thickness of the surface silicon layer 107 may be about 1400 Å, the thickness of the BOX layer 106 may be about 4000 Å and the thickness of the bulk silicon 105 may be about 725 μm.

A device region is defined on the substrate 101. Although one device region is shown, it is however understood that the substrate 101 may include various types of regions (not shown). For example, the substrate may include other device regions for other types of devices. The IC may include logic regions in which logic devices are formed. Depending on the type of IC formed, the logic regions, for example, may include regions for different voltage devices. For example, the logic regions may include regions for high voltage (HV) devices, medium or intermediate voltage (MV) devices and low voltage (LV) devices. Other configurations of logic regions may also be useful. Additionally, other types of device regions may also be provided.

In one embodiment, the device region serves as a device region for a EDMOS transistor. Providing a device region for other types of devices may also be useful. The device region is separated from other regions by an isolation region 180. The isolation region 180 is, for example, a STI region. The isolation region 180 surrounds the device region. The isolation region, for example, extends to the top surface of the BOX layer 106. To ensure that the device region is isolated from other regions, the STI region may extend beyond the top surface of the BOX layer.

To form an isolation region, an isolation trench is formed in the surface crystalline layer which exposes the BOX layer. The trench can be formed by etch and mask techniques. For example, a mask layer, such as photoresist, is formed on the substrate. The mask layer is patterned to form an opening to exposing the surface layer in which the trench is to be formed. An anisotropic etch, such as a reactive ion etch (RIE), etches the surface layer to form an isolation trench. The trench is then filled with a dielectric material, such as silicon oxide. Chemical mechanical polishing (CMP) can be performed to remove excess oxide and provide a planar substrate top surface. Other processes or materials can also be used to form the STIs.

Figure 3B:
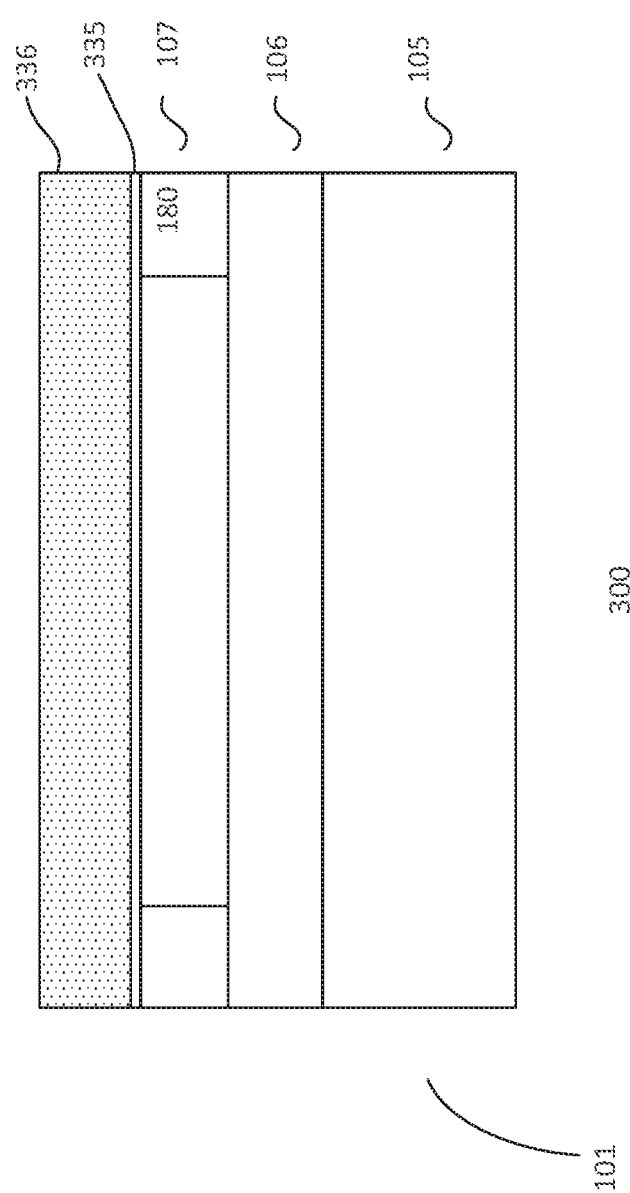
FIGS. 3a-3l show cross-sectional views of an embodiment of a process for forming a device.

In FIG. 3b, after the trench is formed, various layers of the gates are formed on the substrate. As shown, a gate dielectric layer 335 is formed on the substrate. The gate dielectric layer may be formed by thermal oxidation. For example, the gate dielectric 125 is formed by wet oxidation followed by annealing the substrate in an oxidizing ambient. The temperature of the wet oxidation can be, for example, about 600-900° C. The annealing can be, for example, performed at a temperature of about 600-1000° C. The gate dielectric layer, for example, may be a medium voltage of high voltage gate dielectric layer. For example, the thickness of the gate dielectric layer may be about 55-65 Å, and about 100 Å for a medium or high voltage gate dielectric layer. Providing gate dielectric layers formed by other techniques or having other thicknesses may also be useful.

As for the gate electrode layer 336, it may be polysilicon. The thickness of the gate electrode may be about 1000-1600 Å. Other thickness may also be useful. The gate electrode layer may be formed by, for example, chemical vapor deposition (CVD). Other techniques for forming the gate electrode layer may also be useful. The gate electrode layer can be formed as an amorphous or non-amorphous layer. In one embodiment, the gate electrode layer is polysilicon doped with first type dopants. The concentration of dopants in the gate electrode may be about $10^{20}$/cm$^3$. Various techniques may be employed to dope the gate electrode, for example, in-situ doping or ion implantation. Other types of gate layers may also be formed. In some embodiments, the gate layers serve to form dummy gates. For example, a gate-last process may be employed to form high k metal gates.

Figure 3C:
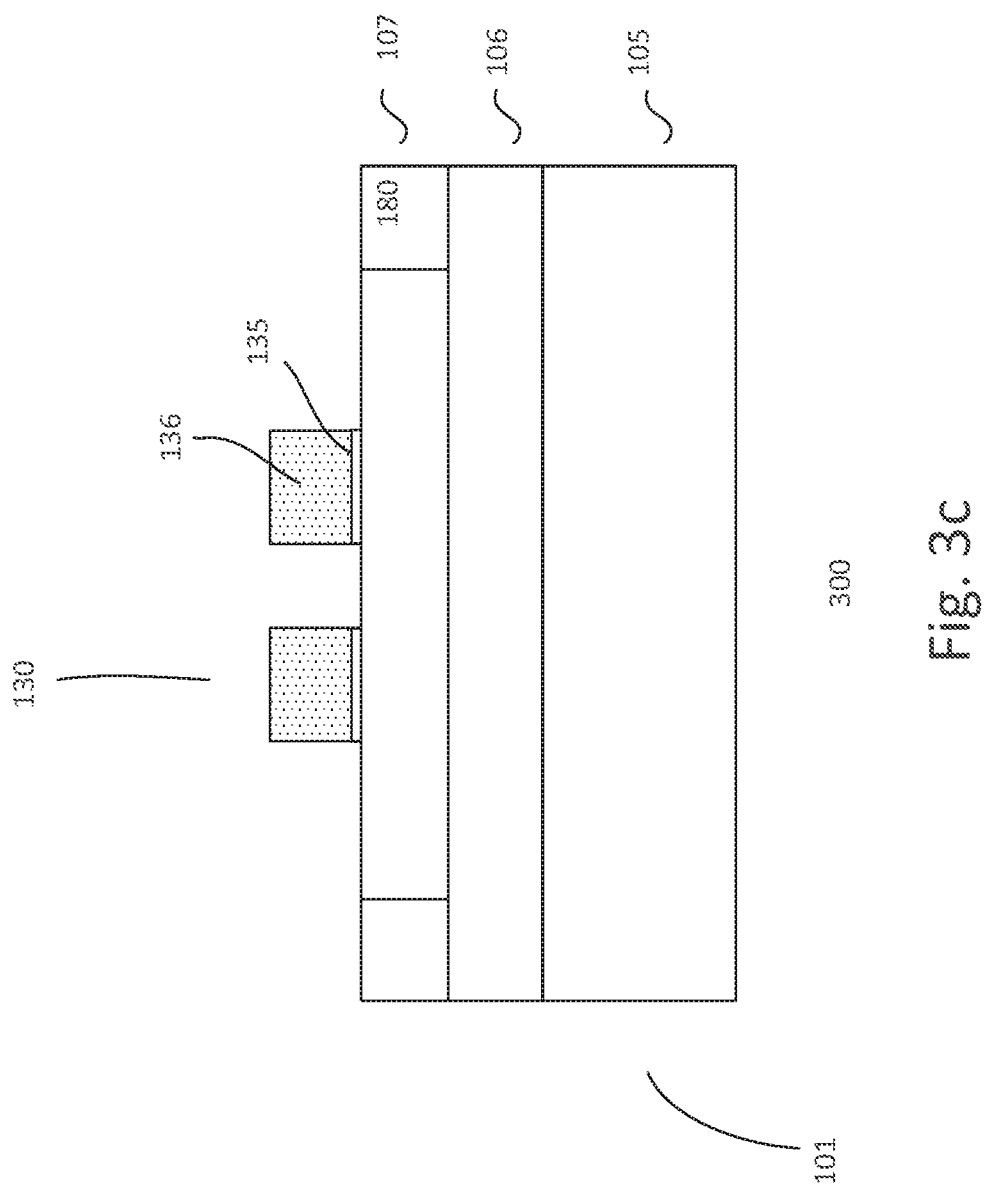

Referring FIG. 3c, the gate layers are patterned to form gates 130. In one embodiment, the gate layers are patterned to form first and second gates of the dual gate transistor. As shown a gate includes a gate electrode 136 over a gate dielectric 135. Patterning the gate layers may be achieved using mask and etch techniques. For example, a patterned mask layer serves as an etch mask is formed on the gate layers. The etch transfers the pattern of the mask to the gate layers. The etch removes the gate layers unprotected by the mask, exposing the substrate. The etch, for example, may be an anisotropic etch, such as a RIE. Other types of etch processes may also be useful.

As shown in FIG. 3d, a first device well 114a is formed. The patterned gate layers are used as an implant mask for forming the first device well. The patterned gate layers, as shown, expose the device region. In one embodiment, a tilted or angled ion implantation is performed to form the first device well. The ion implantation is self-aligned to the edges of the gate layer. The self-aligned ion implantation implants second polarity type dopants into the exposed device region, forming the first device well. For example, boron (B) impurities are implanted into the exposed device region. The first device well serves as a first body well of the transistor.

Figure 3E:
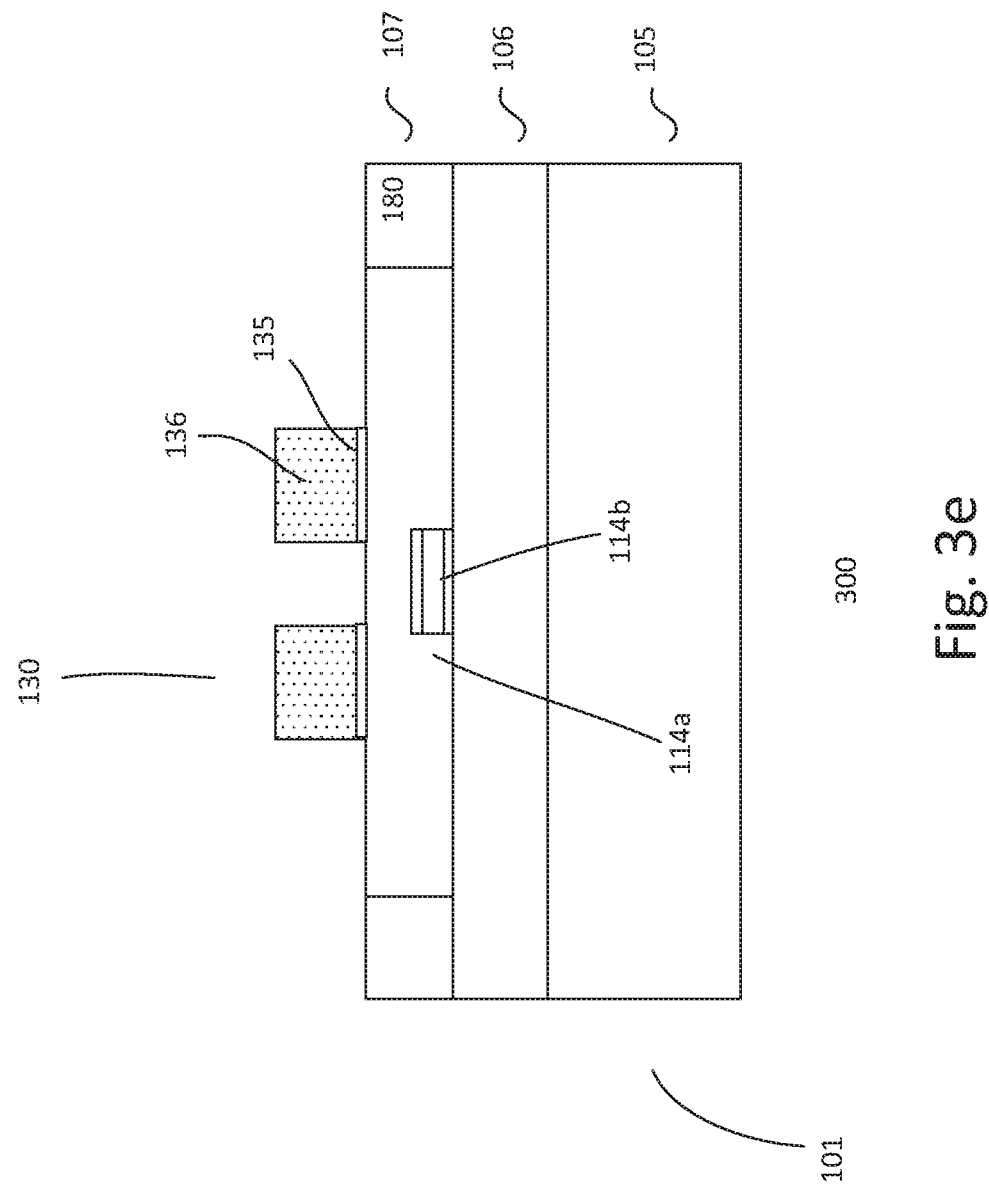

In one embodiment, as shown in FIG. 3e, the process continues by forming a second device or body well 114b. The second body well, for example, may be formed using the patterned gate layers. A vertical ion implantation is performed to form the second device well at the lower portion of the surface crystalline layer 107. The ion implantation is self-aligned to the edges of the gate layer. The self-aligned ion implantation implants second polarity type dopants into the exposed device region, forming the first device well. The second polarity type dopants, in one embodiment, are lighter than the first polarity type dopants used for forming the source. For example, $BF_2$ impurities which have diffusion retarding effect are implanted into the exposed device region. The second device well serves as a second body well of the transistor. The dopant profile of the second body well can be tailored by the choice of dopants and thermal cycles.

Figure 3F:
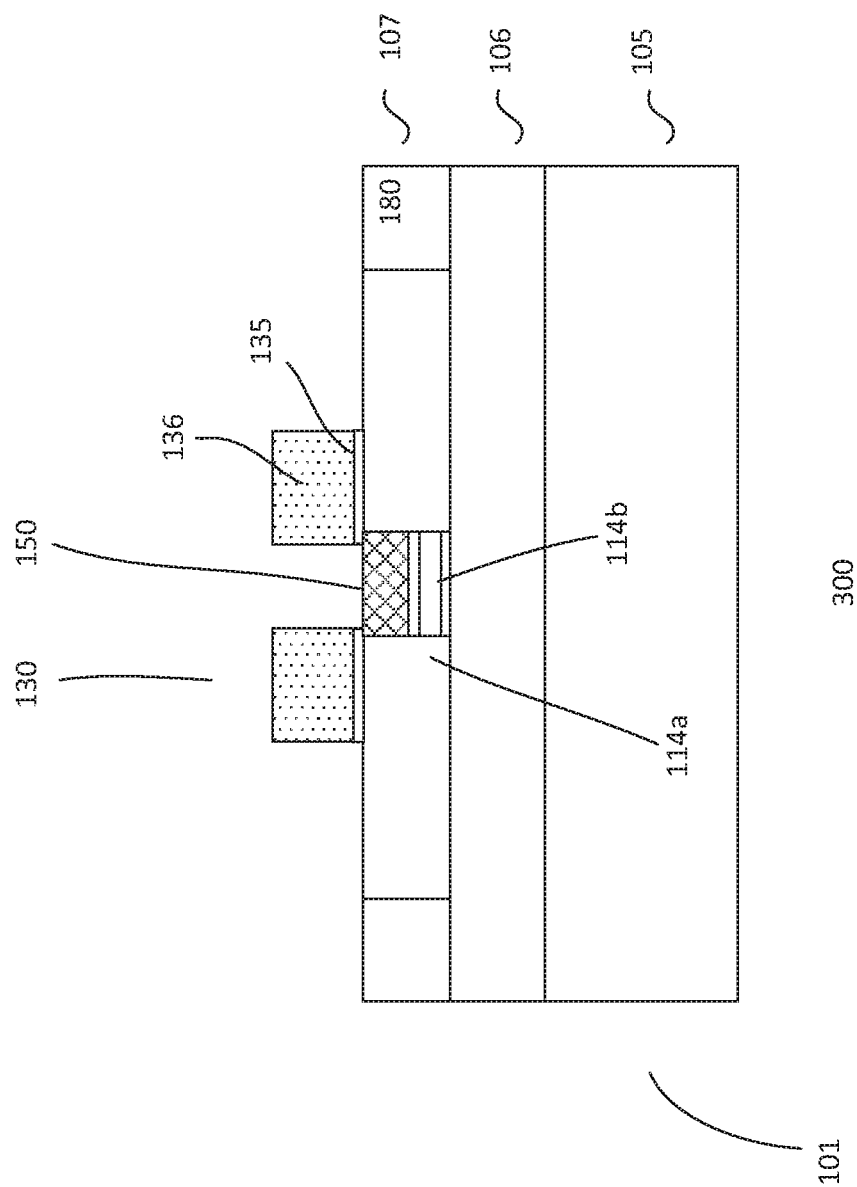

In FIG. 3f, a source 150 is formed over the second body well. In one embodiment, the source is formed by vertically implanting first polarity type dopants using the patterned gate layers as an implanting mask. The first polarity type dopants include heavy dopants, such as As. The vertical implant of heavy dopants ensures that only minimal lateral and vertical diffusion occurs during subsequent thermal processes. In one embodiment, the source is a lightly doped region. In other embodiments, the source is a heavily doped region. The choice of the dopant concentration, for example, depends on device requirements.

Figure 3G:
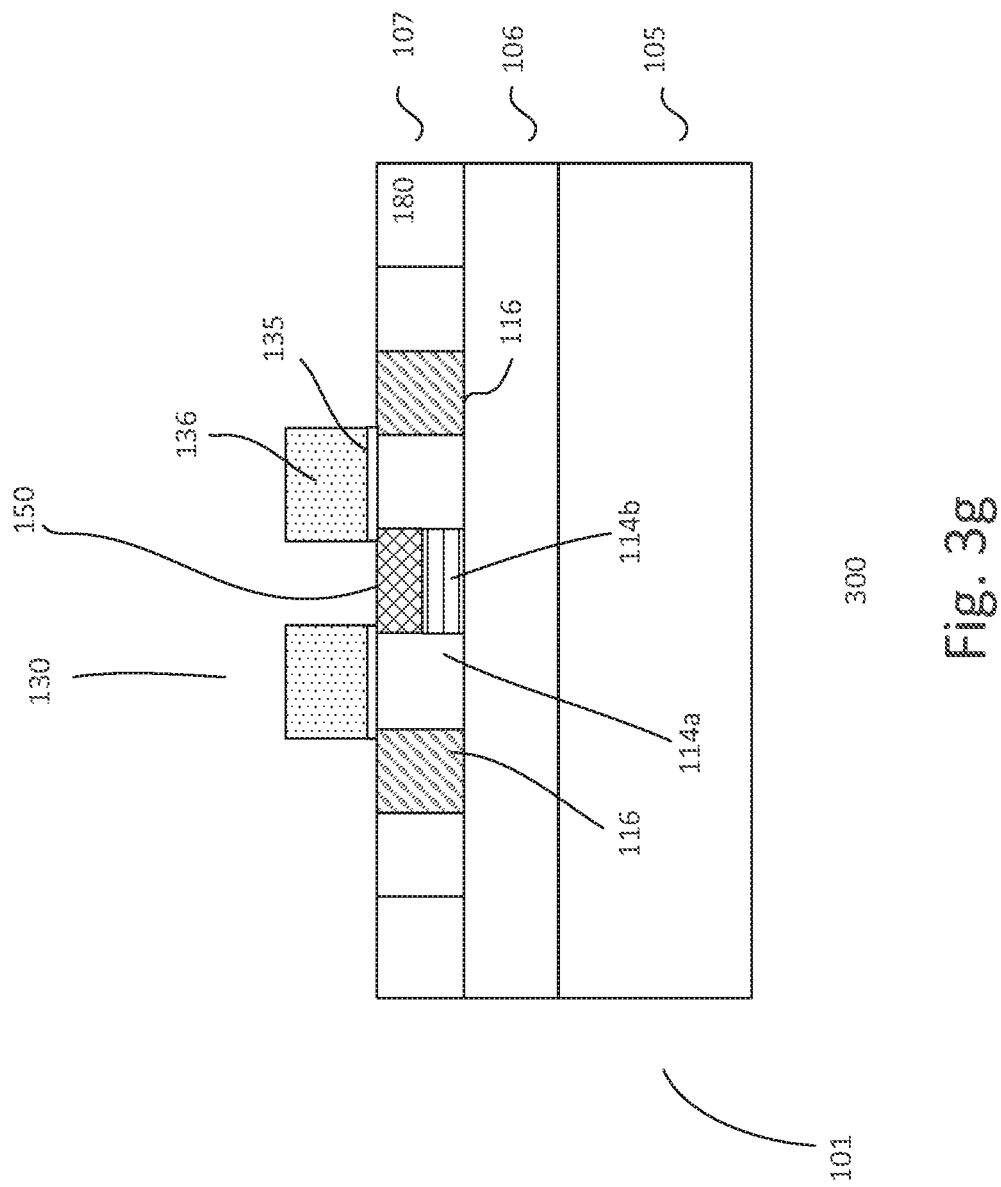

Referring to FIG. 3g, in one embodiment, the process continues to form drift wells 116. The drift wells are lightly doped first polarity type wells. The drift wells are formed by mask and implant techniques. For example, an implant mask may be used for the ion implantation process to form the drift wells in the region exposed by the mask. The ion implantation, in one embodiment, is a vertical ion implantation. The vertical ion implantation implants first polarity type dopants, such as phosphorus (P), into the exposed device region, forming the drift wells. In one embodiment, the dopant concentration of the drift wells may be about $10^{15}$/cm$^3$. The drift wells extend from the surface of the substrate to the BOX layer.

As described, the first body well 114a, second body well 114b, source 150 and drift well are formed in sequence. However, it is understood that other sequences in forming the body wells, source and drift well may also be useful. For example, the second body well and source can be interchanged since they use the same mask. Also, the drift well can be interchanged with the process of forming the body wells and source.

Figure 3H:
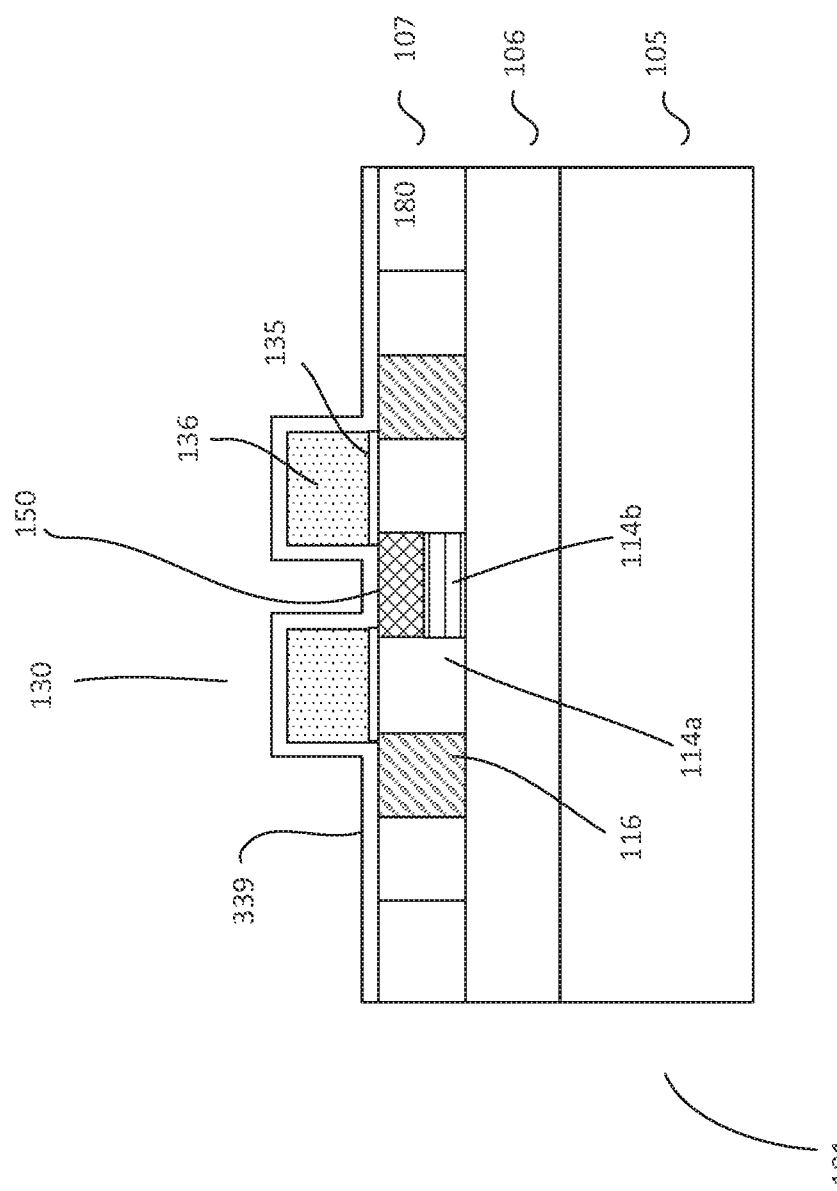
Figure 3I:
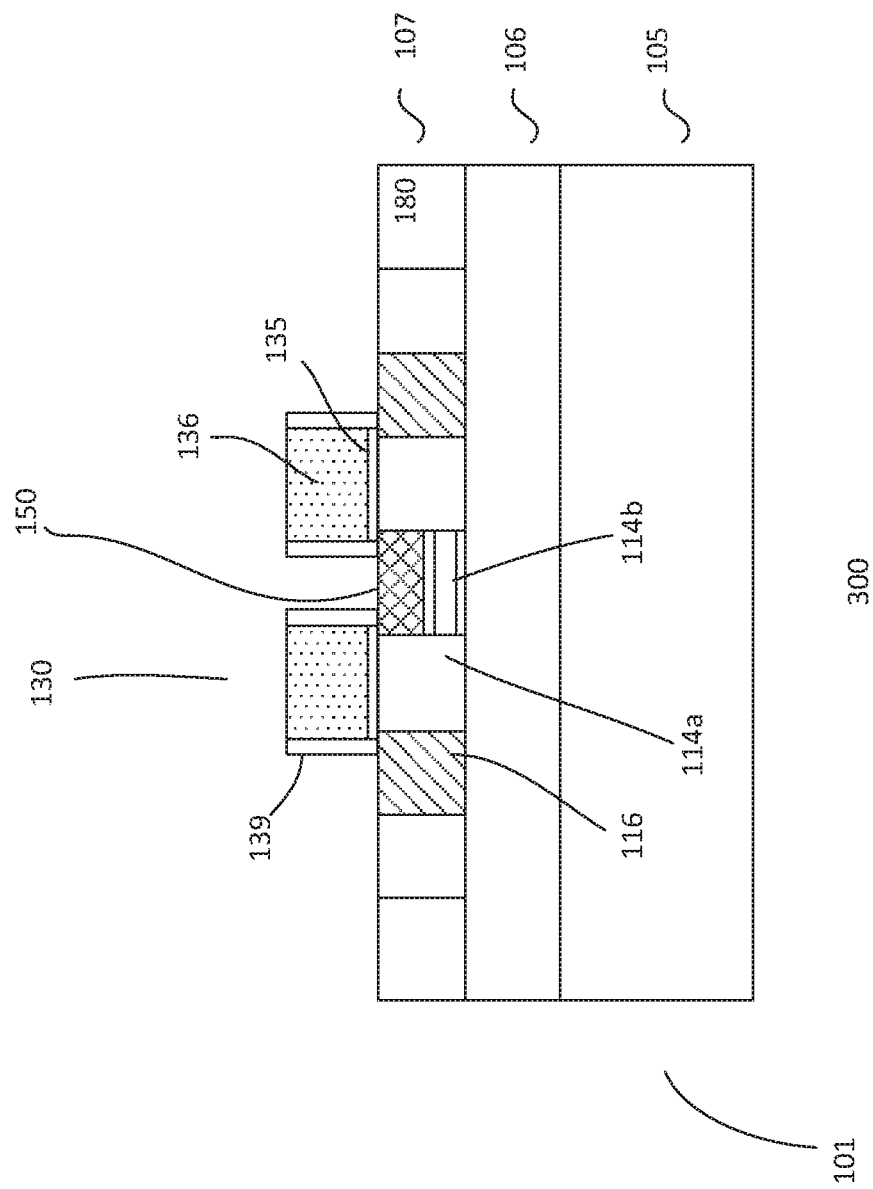

Referring to FIG. 3h, a dielectric spacer layer 339 is formed on the substrate. The dielectric spacer layer, for example, may be a silicon oxide layer. Other types of dielectric layer or layers may also be useful. The dielectric layer may be formed using, for example, CVD. After forming the dielectric layer, an anisotropic etch, such as RIE, is performed. The etch removes horizontal portions of the dielectric layer, leaving sidewall spacers 139 on the sidewalls of the gates, as shown in FIG. 3i.

Figure 3J:
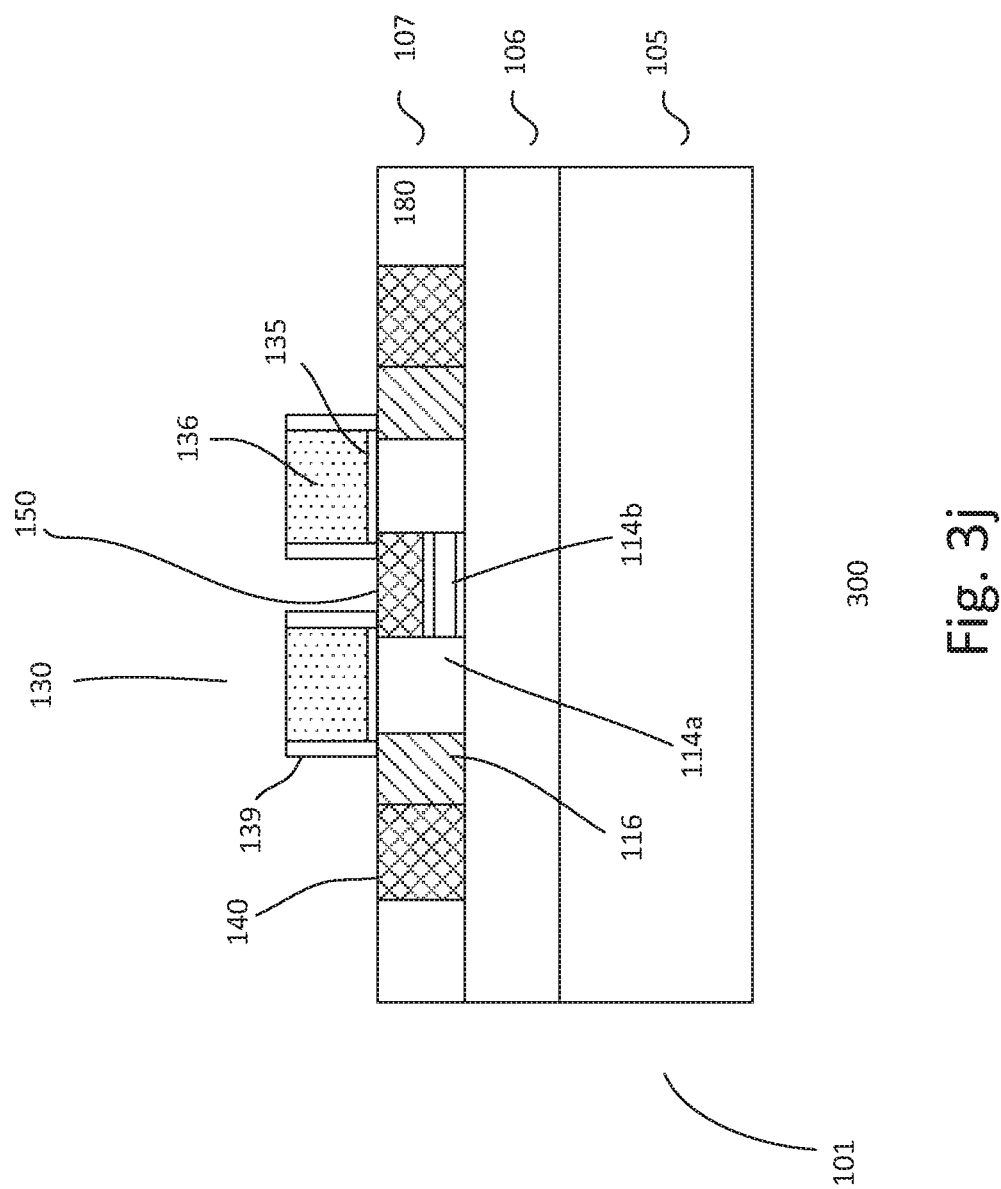

In FIG. 3j, the process continues to form drains 140. The drains are heavily doped first polarity dopants type wells. The drains are formed by mask and implant techniques. For example, an implant mask may be used for the ion implantation process to form the drains. In one embodiment, the drains are formed using the same mask as forming other first polarity type S/D regions. The first polarity dopants, in one embodiment, are heavy dopants, such as arsenic (As). In one embodiment, the mask protects the source side of the EDMOS device. After forming the drains, the mask is removed. For example, the mask is removed by ashing. Other techniques for removing the implant mask may also be useful.

In one embodiment, body contacts are formed in the device region. The body contacts are heavily doped second polarity type dopants. The body contacts may be formed using mask and implant techniques. The body contacts, in one embodiment, extend form the top of the surface layer to the BOX layer. The mask includes opening to form the body contacts.

Figure 3K:
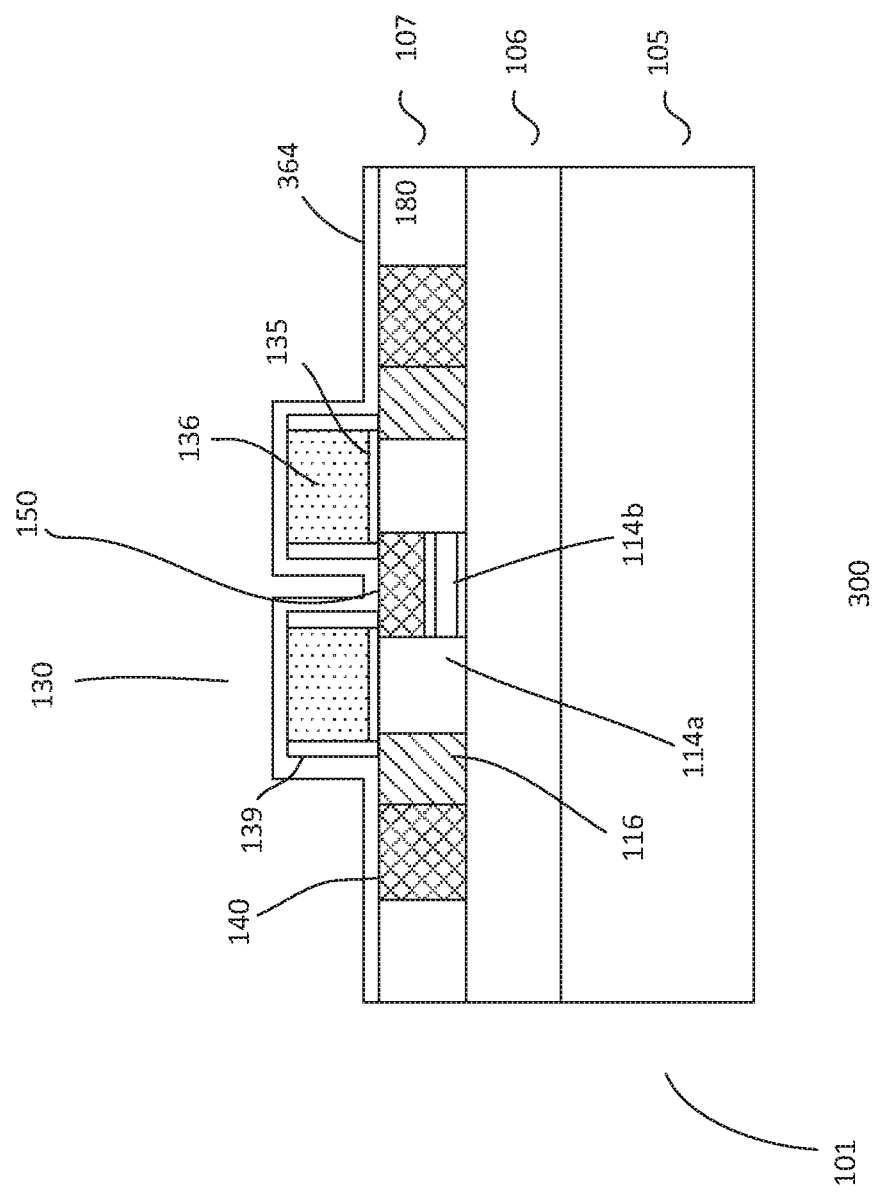
Figure 3:
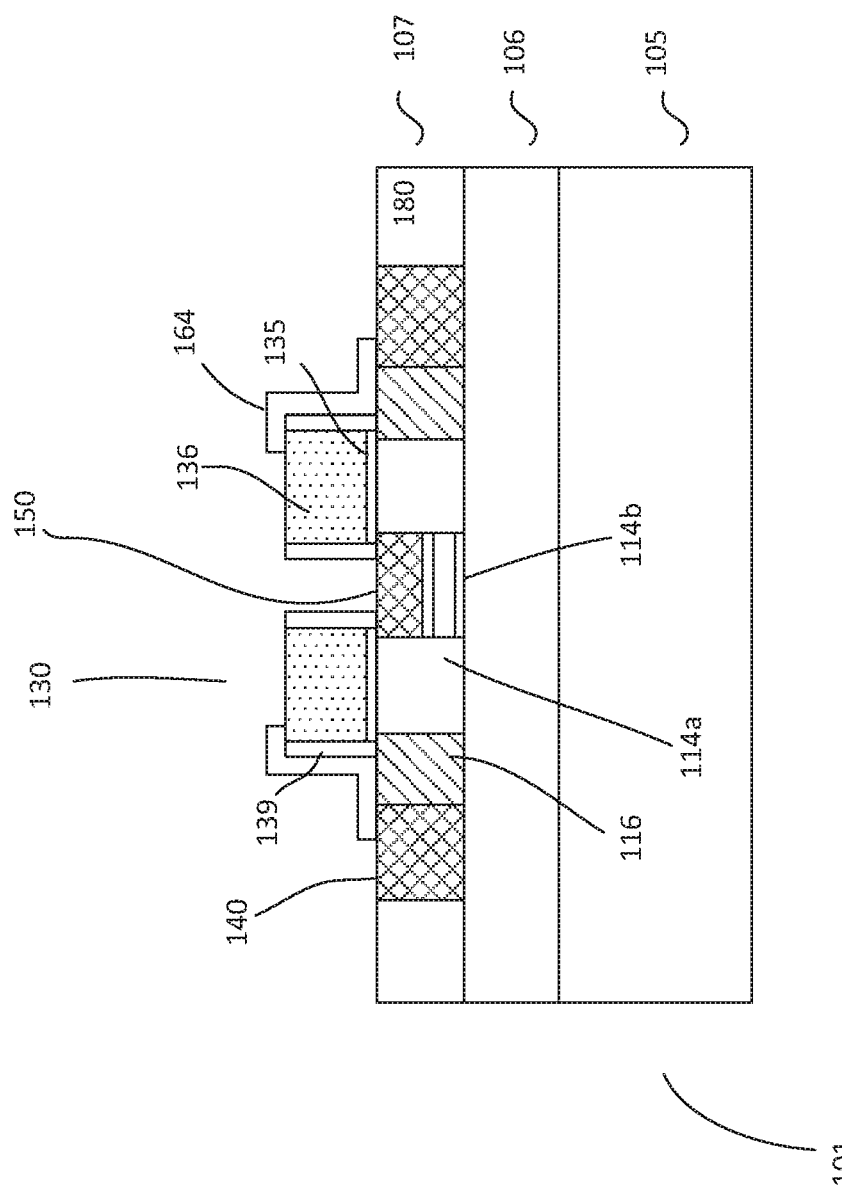

Referring to FIG. 3k, a salicide blocker layer 364 is formed on the substrate. The salicide block layer, for example, is a dielectric layer, such as silicon oxide. Other types of salicide blocker layer may also be useful. The salicide blocker layer is a conformal layer formed by, for example, CVD. The thickness of the salicide blocker layer may be about 400-700 Å. Other thicknesses may also be useful.

As shown in FIG. 3l, the salicide blocker layer is patterned to form salicide blockers 164. The silicide blocker layer may be patterned by, for example, mask and etch techniques. A patterned photoresist mask may be provided over the salicide blocker layer. An anisotropic etch, such as a reactive ion etch (RIE) is used to pattern the salicide blocker layer to form a patterned salicide blocker layer using the patterned photoresist mask. As shown, the patterned salicide blocker layer overlaps the sidewall of the gate on the drain side, a portion of the top surface of the gate adjacent to the sidewall, the top surface of the drift well 116 and a portion of the drain region adjoining the drift well.

The process continues to complete forming the device. For example, additional processes may be performed to complete the device. Such processes may include forming silicide contacts on contact regions of the transistors, premetal dielectric (PMD), interconnect metal levels, final passivation, dicing, packaging and testing.

The embodiments as described result in various advantages. For example, the embodiments as described modulate the junction depth by a low energy LDD implant and a vertical BF2 implant to minimize the downward diffusion of arsenic dopants. This allows the formation of an ultra-shallow source junction which enhances the device breakdown voltage. This in turn enables the linear drain current (Idlin) and saturation drain current (Idsat) to be tuned higher, as it is no longer limited by the on-state breakdown voltage requirements. Furthermore, the embodiments as described also eliminate the kink-effect as seen on the Id.

The embodiments as described also allow the body bias contact region to be formed in the width direction. As a result, the transistor width is no longer limited by the body bias contact region. In addition, the p-type dopants area of the body well, especially in the vertical direction, is increased by employing the vertical $BF_2$ implantation of higher dose. Such increase in the p-type dopants area helps to suppress the parasitic bipolar junction transistor (BJT) effect. The body contact resistance is also reduced by the increased implant dose. Furthermore, the vertical BF2 implant to form the secondary body well has negligible impact on the threshold voltage.

Although the embodiments are described with respect to an extended drain MOS (EDMOS) transistor, it is to be understood that the implementations of the method are not limited as such. The implementations can be extended to metal-oxide-semiconductor (MOS) transistors. For example, an ultra shallow source junction as described can also be implemented on any MOS transistors to achieve similar results, i.e., elimination of kink-effect and parasitic BJT effects. The method of forming the body well which includes forming a self-aligned primary body well and a vertically implanted secondary body well can also be implemented on any MOS transistors to achieve similar results, i.e., reduction in body contact resistance.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
    a substrate;
    a uniformly doped first body well disposed in the substrate;
    a uniformly doped second body well disposed in the first body well, wherein a bottom of the second body well and a bottom of the first body well are contiguous, and wherein the second body well has a lower dopant concentration than the first body well; and
    a transistor disposed over the substrate, wherein the transistor comprises a gate, a source and a drain, and wherein the source is formed in the second body well and is heavily doped with dopants having a larger mass than the dopants of the second body well to produce a box like dopant profile.

2. The device of claim 1 wherein the first body well is doped with second polarity type dopants.

3. The device of claim 2 wherein the second polarity type dopants comprise boron.

4. The device of claim 1 wherein the second body well is doped with second polarity type dopants.

5. The device of claim 4 wherein the second polarity type dopants comprise $BF_2$.

6. The device of claim 1 wherein the gate serves as an implant mask to implant the dopants into the substrate.

7. The device of claim 6 wherein the implant mask comprises a vertical $BF_2$ implant.

8. The device of claim 1 wherein the transistor is a first polarity type transistor.

9. The device of claim 8 wherein the dopants having the larger mass are first polarity type dopants comprising arsenic (As).

10. The device of claim 1 wherein the drain and source are asymmetrical doped region.

11. The device of claim 10 wherein the depth of the drain is deeper than the depth of the source.

12. The device of claim 1 wherein substrate is a silicon-on-insulator (SOI) substrate and wherein the SOI substrate comprises a surface silicon layer, a buried oxide (BOX) layer and a bulk silicon layer.

13. The device of claim 12 wherein the drain extends from a top surface of the surface silicon layer to the BOX layer, and the source extends from the top surface of the surface silicon layer to a partial thickness of the surface silicon layer.

14. The device of claim 12 wherein the first and second device well extend from a top surface of the surface silicon layer to the BOX layer.

15. The device of claim 1 further comprising a first type drift well disposed in the substrate.

16. The device of claim 1 further comprising a body contact of a second polarity type disposed along a channel direction of the transistor.

17. The device of claim 1 wherein the drain is displaced from the gate.

18. A device comprising:
a substrate;
a uniformly doped first body well disposed in the substrate;
a uniformly doped second body well disposed in the first body well, wherein a bottom of the second body well and a bottom of the first body well are contiguous; and
a transistor over the substrate, wherein the transistor comprises a gate, a source and a drain, and wherein the source
is formed in the second body well,
has a depth of a lightly doped drain (LDD) extension, and
is heavily doped with dopants having a larger mass than the dopants of the second body well to produce a box like dopant profile.

19. The device of claim 18 wherein the first body well is doped with second polarity type dopants, and wherein the second polarity type dopants comprise boron.

20. The device of claim 18 wherein the second body well is doped with second polarity type dopants, and wherein the second polarity type dopants comprise $BF_2$.

* * * * *